United States Patent [19]
Test

[11] Patent Number: 6,068,180
[45] Date of Patent: May 30, 2000

[54] SYSTEM, APPARATUS, AND METHOD FOR CONNECTING A SEMICONDUCTOR CHIP TO A THREE-DIMENSIONAL LEADFRAME

[75] Inventor: Howard R. Test, Plano, Tex.

[73] Assignee: Texas Instruments Incorporated, Dallas, Tex.

[21] Appl. No.: 08/991,168

[22] Filed: Dec. 16, 1997

Related U.S. Application Data

[60] Provisional application No. 60/033,407, Dec. 18, 1996.

[51] Int. Cl.⁷ .......................... B23K 31/02; B23K 37/00; B23K 5/22
[52] U.S. Cl. .................. 228/180.5; 228/4.5; 228/44.7; 228/212
[58] Field of Search .................... 228/212, 44.7, 228/4.5, 180.5; 269/270, DIG. 903

[56] References Cited

U.S. PATENT DOCUMENTS

| | | | |
|---|---|---|---|
| 3,995,845 | 12/1976 | Scheffer | 269/254 CS |
| 4,309,849 | 1/1982 | Kowalski et al. | |
| 4,378,902 | 4/1983 | Fedak | 228/6.2 |
| 4,496,965 | 1/1985 | Orcutt et al. | 357/70 |
| 4,582,309 | 4/1986 | Moxon et al. | 269/303 |
| 4,796,078 | 1/1989 | Phelps, Jr. et al. | 357/68 |
| 4,891,687 | 1/1990 | Mallik et al. | 357/70 |
| 4,987,473 | 1/1991 | Johnson | 357/70 |
| 5,054,193 | 10/1991 | Ohms et al. | 29/840 |
| 5,107,935 | 4/1992 | McBride | 173/130 |
| 5,291,059 | 3/1994 | Ishitsuka et al. | 257/666 |
| 5,332,463 | 7/1994 | Eberlein et al. | 156/556 |
| 5,530,281 | 6/1996 | Groover et al. | 257/666 |
| 5,558,267 | 9/1996 | Humphrey et al. | 228/4.5 |
| 5,639,385 | 6/1997 | McCormick | 216/14 |
| 5,647,528 | 7/1997 | Ball et al. | 228/180.5 |
| 5,676,301 | 10/1997 | Hernandez et al. | 228/44.7 |

FOREIGN PATENT DOCUMENTS

| | | |
|---|---|---|
| 59-161041 | 9/1984 | Japan. |
| 60-195945 | 10/1985 | Japan. |
| 6-349880 | 12/1994 | Japan. |
| 7-283265 | 10/1995 | Japan. |

*Primary Examiner*—Patrick Ryan
*Assistant Examiner*—Kiley Stoner
*Attorney, Agent, or Firm*—Mark A. Valetti; Carlton H. Hoel; Frederick J. Telecky, Jr.

[57] ABSTRACT

A system (270, 370) for connecting a semiconductor chip (22, 322) to a leadframe (12), the system (270, 370) includes a three-dimensional leadframe (12) and a bonding support mechanism (202, 302, 402). The leadframe (12) may include a first lead (32, 132, 332, 432) having a first base portion (144), a first lead tip (42, 142, 342, 442), and a first longitudinal axis (305); a second lead (30, 130, 330, 430) having a second base portion (140, 321), a second lead tip (36, 136, 336, 436), and a second longitudinal axis. The first lead (32, 132, 332, 432) and second lead (30, 130, 330, 430) formed substantially adjacent to each other, and the second lead (30, 130, 330, 430) having a stepped portion (38, 138, 338, 438) such that the lead tips (42, 142, 342, 442, 36, 136, 336, 436) of the first lead (132, 332, 432) and second lead (130, 330, 430) are separated in a Z-direction (52) and in a Y-direction (52). The bonding support mechanism (202, 302) for holding the three-dimensional leadframe (12) may include a support body (215, 315), a trough (203, 303) formed on the support body (215, 315). The trough (203, 303) may have a first surface (204, 304) at a first elevation, where the first surface (204, 304) is for supporting the second lead tip (36, 136, 336). A second surface (206, 306) may be formed on the support body (215, 315) at a second elevation and substantially adjacent to the first surface (204, 304). The second surface (206, 306) is for supporting the first lead tip (42, 142, 342). The first elevation and second elevation may be displaced from each other. The bonding support mechanism (202, 302) may have an angled surface (210, 310) for accommodating a stepped portion (38, 138, 338, 438) of the second lead (30, 130, 330) and may have additional support surfaces (376, 319).

18 Claims, 4 Drawing Sheets

SYSTEM, APPARATUS, AND METHOD FOR CONNECTING A SEMICONDUCTOR CHIP TO A THREE-DIMENSIONAL LEADFRAME

This application claims priority under 35 USC § 119(e)(1) of provisional application number 60/033,407 filed Dec. 18, 1996.

TECHNICAL FIELD OF THE INVENTION

This invention relates generally to the field of integrated circuits, and more particularly to a system, apparatus, and method for connecting a semiconductor chip to a three-dimensional leadframe.

BACKGROUND OF THE INVENTION

A leadframe may be electrically coupled to an integrated circuit during an aspect of the fabrication of an electronic component. Methods for coupling the leadframe to the integrated circuit include wire bonding such as ball bonding or wedge bonding. The leadframe, integrated circuit, and bond wire may be encapsulated by a plastic molding process to form a package.

Bonding with bonding wire entails securing a bonding wire between a contact or a bond pad on an integrated circuit and a bonding site or target on a lead tip of a lead or lead finger on a leadframe. As the distances between bond pads on integrated circuits are reduced, the size of the integrated circuit die can be reduced while producing substantially equal performance and using less silicon.

Many leadframe manufacturing processes have a limit on the minimum width of the metal lead and the distance between leads that can be produced. To accommodate the smaller distances between bond pads, the bonding sites on the leads have become more remote from the semiconductor die as the die size has been reduced. To provide for closer leads or more dense leads at the same distance, three-dimensional leads have been developed. For example, U.S. Pat. No. 4,987,473, entitled *Leadframe System with Multi-Tier Leads,* discloses lead tips that have been bent upwards and some bent downwards into different planes to provide for denser packaging of lead tips without fear of electrical shorts. The '473 Patent does not disclose or teach efficient methods of manufacturing multi-level leads or an efficient bonding technique.

Three-dimensional leads have also been utilized in an effort to minimize wire crossing and shorting during the fill process of packaging a semiconductor chip. For example, U.S. Pat. No. 5,530,281, entitled *Wire Bond Lead System with Improved Wire Separation,* discloses a leadframe with three-dimensional leads for this purpose. The '281 Patent does not, however, disclose an efficient method for making leads or for bonding to such leads.

As an aspect of applying bonding wires between lead tips and bond pads, a heating block may be used. For example, U.S. Pat. No. 5,558,267, entitled *Moat For Die Pad Cavity in Bond Station Heater Block,* which is incorporated herein for all purposes, shows, a heating block to assist with bonding. The heating block may be heated by a heater as is known in the art.

SUMMARY OF THE INVENTION

According to an aspect of the present invention, a system, apparatus and method for connecting a semiconductor chip to a leadframe are provided that address the shortcomings of prior devices and techniques. According to an aspect of the present invention a system for connecting a semiconductor chip to a leadframe includes a three-dimensional leadframe and a bonding support mechanism having a trough.

According to an aspect of the present invention the leadframe may have a first lead having a first base portion, a first lead tip, and a first longitudinal axis, a second lead having a second base portion, a second lead tip, and a second longitudinal axis, the first and second leads formed substantially adjacent to each other, and the second lead having a stepped portion such that the lead tips of the first and second leads are separated in a Z-direction and in a Y-direction (where the Y-direction is parallel to the longitudinal axis of the leads and an X-direction intersects adjacent leads).

According to another aspect of the present invention, the bonding support mechanism may include a support body, with the trough formed on the support body, and the trough having a first surface at a first elevation, the first surface for supporting the second lead tip, and the bonding support mechanism may include a second surface, which is for supporting the first lead tip formed on the support body at a second elevation and substantially adjacent to the first surface. According to another aspect of the present invention a bonding support mechanism may have an angled surface to accommodate a stepped portion of a downset lead of a leadframe.

According to another aspect of the present invention, a method for connecting a semiconductor chip to a leadframe may include the steps of forming a three-dimensional leadframe with a first lead having a first base portion, a first lead tip, and a first longitudinal axis; forming a second lead having a second base portion, a second lead tip, and a second longitudinal axis, and with the first and second leads formed substantially adjacent to each other; forming a stepped portion on the second lead; and bonding lead wires to the plurality of leads by placing the first lead tip of the first lead on a first surface of a ridge of a bonding support mechanism and placing the second lead tip of the second lead on a second surface formed as part of a trough of a bonding support mechanism, and applying bonding wires between the chip and the first lead tip and second lead tip.

A technical advantage of the present invention is that three-dimensional leads may be efficiently manufactured and bonded to a semiconductor chip. Another technical advantage of the present invention is that the trough of the bonding support mechanism facilitates positioning of the leads with respect to the bonding support mechanism. Another technical advantage of the present invention is that a bonding support mechanism is provided that is relatively easy to manufacture.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

The preferred embodiment of the present invention and its advantages are best understood by referring to FIGS. 1 through 9 of the drawings, like numerals being used for like and corresponding parts of the various drawings.

Figure 1:
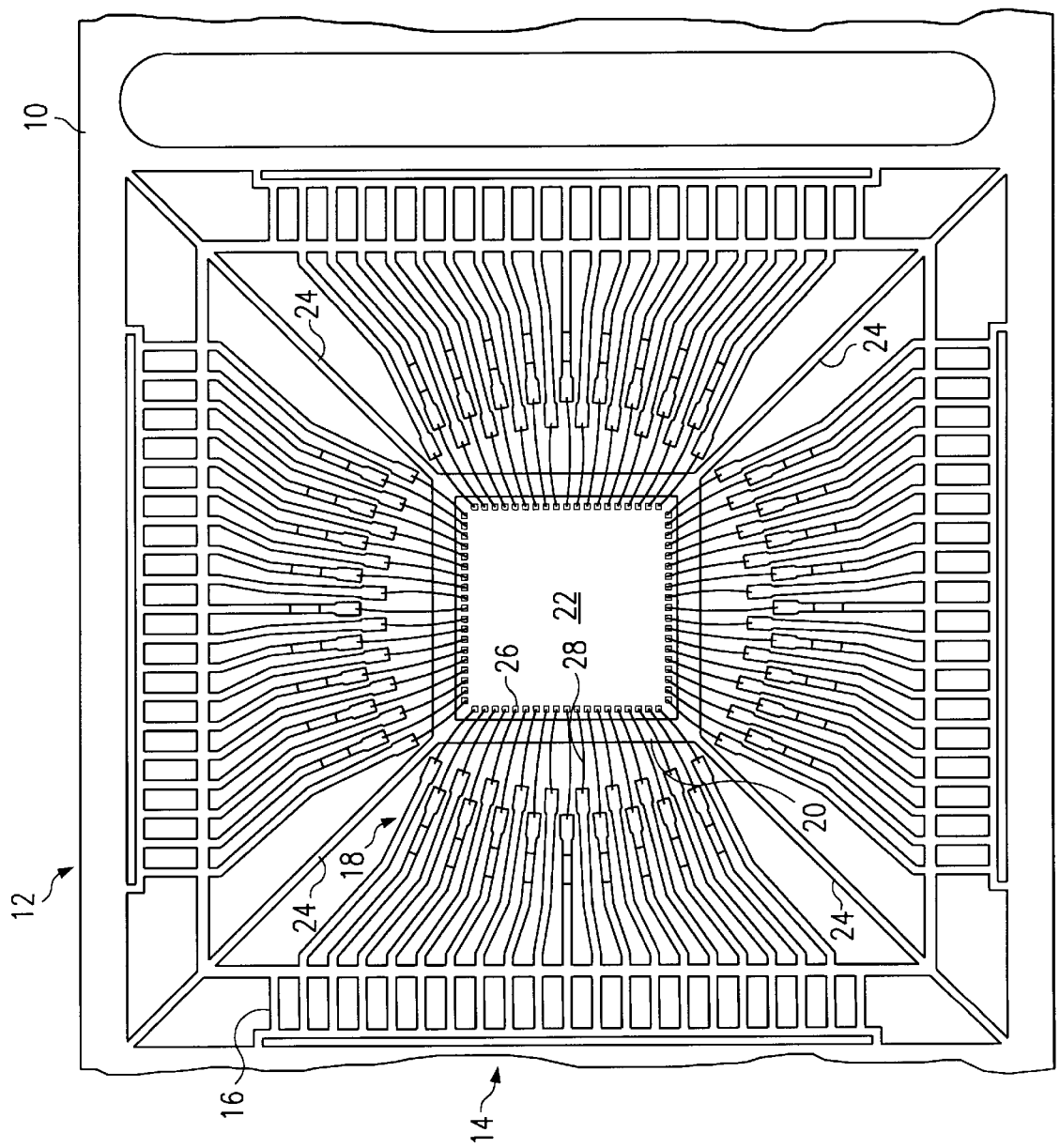
FIG. 1 is a plan view of a leadframe according to an aspect of the present invention.

Referring to FIG. 1, a leadframe strip 10, which has leadframe 12 formed according to an aspect of the present invention, is shown. Leadframe 12 has a number of basic leadframe features 14 including leads 16, which will allow the final package to be electrically coupled to electronic systems. Leadframe 12 is formed with a plurality of leads 18. In a center portion of leadframe 12 is a die pad or paddle 20 on which a semiconductor chip 22 is attached. Die pad 20 is supported by a plurality of securing leads or straps 24. Semiconductor chip 22 has a plurality of bonding pads 26 on a surface.

Bond pads 26 may be electrically coupled to leadframe 12 by the application of bonding wires 28 between the plurality of leads 18 and the bonding pads 26. The connections involving bonding wire 28 may be made by any of a number of techniques such as ball bonding or wedge bonding. The leads 18 are supported during bonding by a bonding support mechanism as will be described in connection with FIGS. 6–9.

Figure 2:
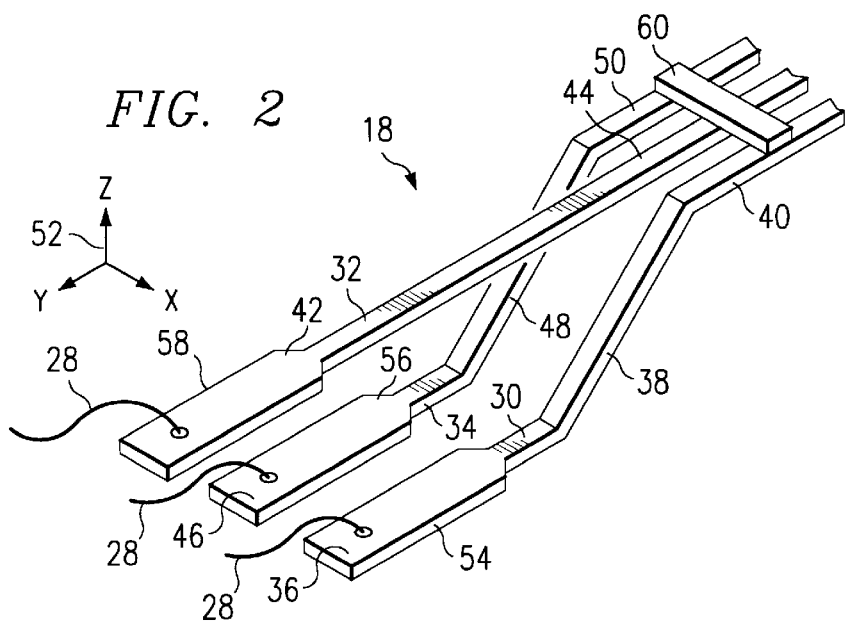
FIG. 2 is a perspective view of leads on a leadframe for bonding according to an aspect of the present invention.

Referring now to FIG. 2, a perspective view of a portion of leadframe 12 is shown, and in particular, three leads from the plurality of leads 18 (FIG. 1) are shown. Three leads are shown for illustration purposes, but it is to be understood that the description of the three leads may apply analogously to all of the plurality of leads 18. A first lead 30, second lead 32, and third lead 34 are shown. First lead 30 has a bond tip or lead tip 36, a step or stepped portion 38, and a lead base portion 40. Second lead 32 has lead tip 42 and a lead base portion 44. As with lead 30, third lead 34 has a lead tip 46, a step or stepped portion 48, and a lead base portion 50. Stepped portions 38 and 48 may be formed by any number of techniques such as adding creases, bending, arching or otherwise causing the leads 30 and 34 to have portions in different planes with respect to the Z-axis for the axis orientation shown at reference numeral 52. The end portion of each lead 30, 32, and 34 where the lead tips 36, 42, and 46 are found may be referred to as the terminus portion of each and referenced 54, 56, and 58, respectively.

An insulating material or tape such as a polyimide tape 60 may be applied on the base portion 40, 44, and 50 of the leads 30, 32, and 34. Tape 60, among other things, provides mechanical stability to the leads 30, 32, and 34. The base portions 40, 44, and 50 may be substantially coplanar in the area where polyimide tape 60 is applied.

Bonding wire 28 may be attached to the lead tips 36, 42, and 46, as shown. By forming stepped portions 38 and 48 on some of the leads, e.g. leads 30 and 34, it is possible to place the lead tips, e.g., 36, 42, and 46, in close proximity in the X-Y plane for the axis orientation shown at 52, while providing adequate clearance between bonding sites or lead tips 36, 42 and 46. Because of the clearance in the Z-direction (for the axis orientation shown at 52), it allows a fine pitched leadframe 12 having leads 18 relatively close to the plurality bond pads 26 on chip 22, and this, among other things, allows shorter bonding wires 28.

Figure 3:
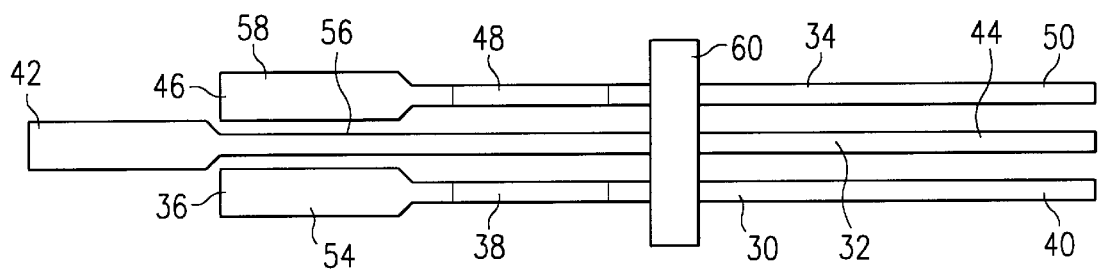
FIG. 3 is a plan view of a portion of a leadframe for bonding according to an aspect of the present invention.
Figure 4:
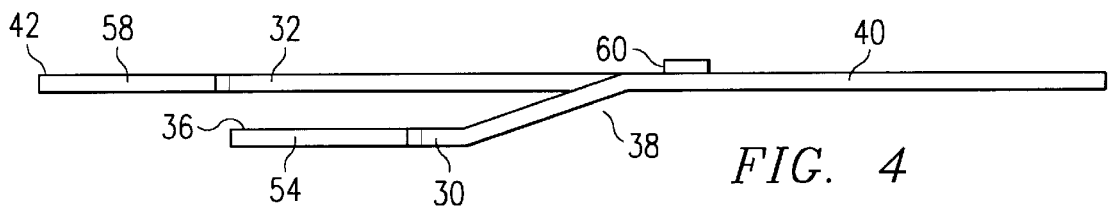
FIG. 4 is an elevational, side view of a portion of the leadframe shown in FIG. 3.
Figure 5:
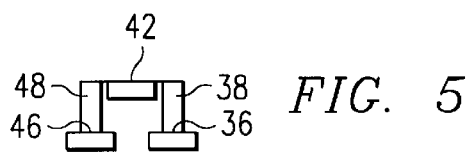
FIG. 5 is an elevational, end view of a portion of the leadframe shown in FIGS. 3 and 4.

FIGS. 3, 4, and 5 show a plan view, side elevational view, and end elevational view respectively for the portion of leads 18 of FIG. 2. It should be noted that a pattern of offsetting every other lead with a step, e.g., 38 and 48, is suggested, but other patterns of offsetting leads 18 may be used.

There are a number of ways in which one might manufacture a leadframe, such as leadframe 12, according to the present invention. A coiled metal material for the leadframe strip may be etched or stamped to form leadframe features, e.g. 14 in FIG. 1. The leadframe can then go through a plating process. Next, the leadframe may be cut and offset. The leadframe may be cut to an appropriate length for its application, and the die pad, e.g. 20 in FIG. 1, may be offset by displacing securing leads 24 in a Z-direction to account for a chip, e.g. chip 22. A number of the leads may be then downset or offset, e.g. a number of the plurality of leads 18 in FIG. 1, to produce a higher density of leads by utilizing separation in the Z-direction for the orientation 52 shown in FIG. 2.

According to one aspect of the present invention, stamping processes are used to form leads having an offset. Two process additions—line punching and offsetting—may be added to the leadframe manufacturing process. Punching may involve separating material and not actually removing material. The offsetting step involves downsetting alternate adjacent leads in the Z-axis either during the stamping process or during the die pad offset process. A chemical etch could be used for some of the separation if desired.

With reference to FIG. 2, the leads 30, 32, and 34 may be formed by using a blanking process to separate portions of the leadframe to form leads 30, 32, and 34 from about the external lead portion 16 (FIG. 1) through the base portion 40, 44, and 50, where for leads 30 and 34 the steps 38 and 48 begin. The portion of the leadframes 30, 32, and 34 going from the start of the steps 38 and 48, which is proximate the base portions 40 and 50, to the lead tips 36, 42, and 46 may be formed by using a shearing or lancing process. The shears may be used to both cut and to displace leads 30 and 34 relative to lead 32 with respect to the Z-direction for axis orientation 52. Note that while FIG. 2 shows distinct bending points forming steps 38 and 48, a more gradual bend or displacement may be used and may result from the shearing process.

Figure 6:
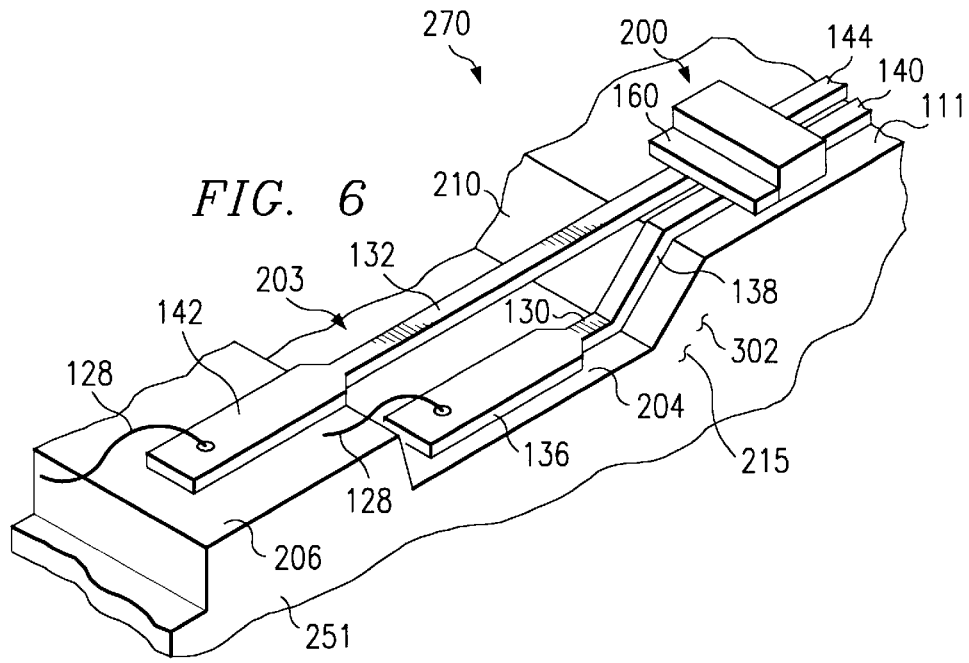
FIG. 6 is a perspective view of a portion of a bonding support system according to an aspect of the present invention.

Referring to FIG. 6, a system 270 for connecting a semiconductor chip to a leadframe is shown. System 270 may include leads 130 and 132 and bonding support mechanism 202. The bonding support mechanism or heating block 202 may be used to assist and provide support during bonding of leads, for example leads 130 and 132. Support mechanism 202 includes support body 215 formed with surfaces that will be described below.

Lead 130 has a bonding or a lead tip 136, and lead 132 has lead tip 142. Leads 130 and 132 have base portions 140 and 144, respectively. Lead 130 has a stepped portion 138. Insulating material or tape 160, e.g., polyimide tape, is applied on the base portions 140 and 144 of leads 130 and 132. Bonding wire 128 may be coupled to the lead tips 142 and 136 while the leads 130 and 132 are supported by mechanism 202. It will be appreciated that leads 130 and 132 are analogous to those shown in FIGS. 1–4.

Leads 130 and 132 are shown held in place against support 202 by a clamping mechanism 200. Clamping mechanism 200 may be positioned just outboard of tape 160. Clamping mechanism 200 may securely hold leads 130 and 132 on a bonding support mechanism 202 during bonding. Bonding support mechanism 202 is formed from a support body 215 that accommodates the separation in a Z-direction of adjacent leads 130 and 132.

Lead tip 136 of lead 130 rests upon a first support surface 204 of bonding support mechanism 202. Surface 204 is at a first elevation, which refers to a Z-axis location for the same axis orientation 52 of FIG. 2. Lead tip 142 of lead 132 may rest upon a second support surface 206, which is formed on a ridge 251 of bonding support mechanism 202. Second support surface 206 is at a second elevation. An angled support surface 210 may be angled to match the bend or curvature of stepped portion 138. A base support surface 111 may be formed on body 215 for supporting the base portions 140 and 144 of leads 130 and 132. Support surfaces 204 and 206 of bonding support mechanism 202 will provide support for lead tips 136 and 142 during the bonding process to resist forces that may be developed by a capillary of a bonding tool. A third surface on body 215 may be provided to support the chip paddle as shown in FIGS. 7 and 8.

Figure 7:
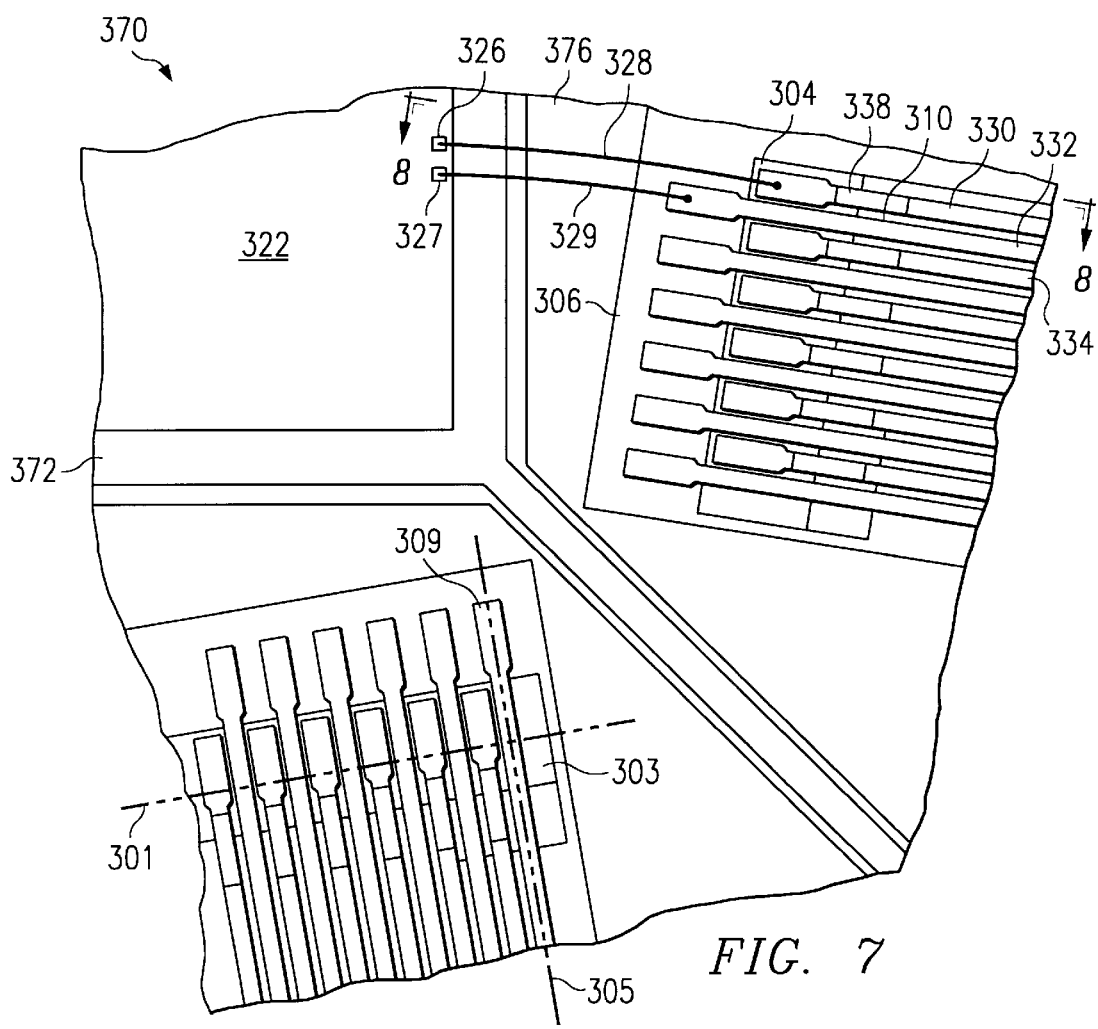
FIG. 7 is a plan view of a system for connecting a semiconductor chip to a leadframe.
Figure 8:
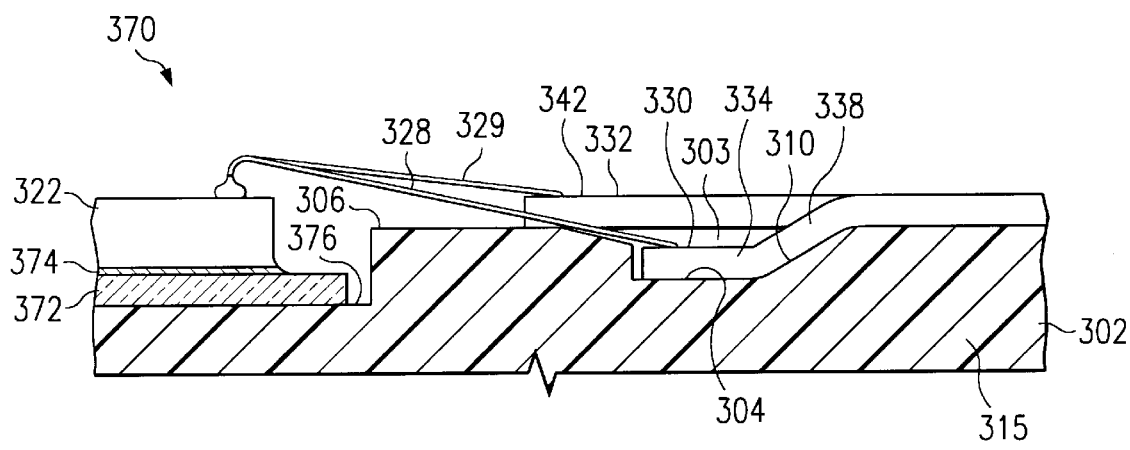
FIG. 8 is a cross-sectional view of the system of FIG. 7 taken along line 8—8.

Referring now to FIGS. 7 and 8, a system 370 for connecting a semiconductor chip to a leadframe such as leadframe 12 (FIG. 1) is shown. System 370 may include leads, such as leads 330, 332 and 334, involving a separation in a Z-direction (for orientation 52 in FIG. 2) and a bonding support mechanism 302. For purposes of illustration, bonding wire 328 is shown connecting bonding pad 326 on chip 322 to first lead 330, and bonding wire 329 is shown connecting a pad 327 on chip 322 to a second lead 332. Other bonding pads on chip 322 are not shown. Chip 322 is shown on a die paddle 372 with a die-attach adhesive 374 between chip 322 and die paddle 372.

As shown best in FIG. 8, chip 322 and paddle 372 along with the leads, such as leads 330 and 332, are accommodated by bond support mechanism or heating block 302. Supporting mechanism 302 may be formed with a support body 315 having features as will be discussed below.

Bond support mechanism 302 has a trough 303 with a first surface 304 for receiving and supporting the downwardly displaced leads such as lead 330. As shown in FIG. 7, trough 303 has a longitudinal axis 301 substantially perpendicular to a longitudinal axis of the leads, such as axis 305 of lead 309. First surface 304 is formed at a first elevation, which refers to a location with respect to the Z-axis for the same axes orientation 52 shown in FIG. 2. Adjacent to first surface 304 is an angled surface 310 that is shaped to accommodate the bend or curvature of stepped portion 338 of the downwardly displaced leads, such as lead 330. Support mechanism 302 has a second surface 306 for supporting the straight or planar leads, such as lead 332. The second surface 306 is formed at a second elevation.

Adjacent to second surface 306 is a third surface 376 for supporting die paddle 372 with chip 322. The third surface is formed at a third elevation. The leads, such as leads 330, 332, and 334, may be securely held against surfaces 304, 306, and 310, by a clamping mechanism, such as clamping mechanism 200 of FIG. 6.

FIGS. 7 and 8 only show a portion of chip 322, the leads associated with chip 322, and support mechanism 302, but it is to be understood that support mechanism 302 would be extended and mirrored to accommodate all the leads associated with chip 322.

System 370 allows for the chip 322 and paddle 372, along with leads such as leads 330, 332 and 334, to be placed on top of support mechanism 302 which, because of the aligning of surfaces such as step 338 with surface 310, allows for easy positioning of chip 322 and leads 330, 332 and 334 with respect to support mechanism 302 and provides appropriate bonding support. Once bonding is complete with bonding wires 329 and 328, the chip paddle 372, chip 322, and lead fingers 330, 332 and 334 may be removed from the support mechanism 302. Support mechanism 302 provides for quick aligning and full support during the bonding process.

The use of continuous trough 303 is made possible by the lead tip of the downwardly displaced leads, such as lead tip 336 of lead 304, being pulled back away from the lead tips of the planar leads, such as lead tip 342 of lead 332. Manufacturing the leads, e.g. 330, 332, 334, with this feature allows for their placement in mechanism 302 as shown in FIGS. 7 and 8. If a displacement is not as complete, a comb-like approach may be used as shown in FIG. 9.

Figure 9:
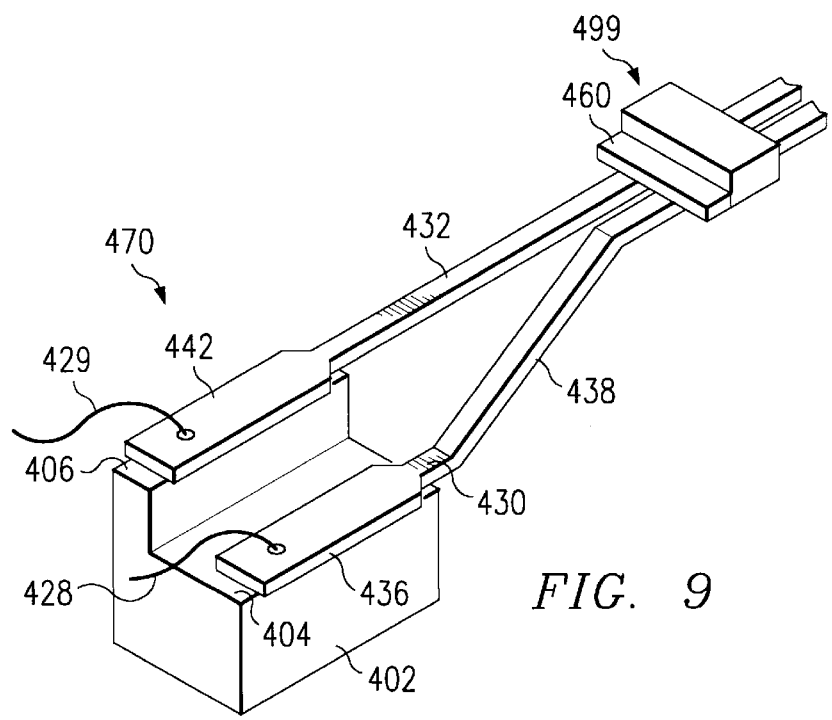
FIG. 9 is a perspective view of another support mechanism according to an aspect of the present invention.

Referring now to FIG. 9, a lead 432 that is substantially planar is shown adjacent to downset lead 430. Lead 430 is downset with a stepped portion 438. Leads 430 and 432 are shown in use with bonding support system 470 that includes a bonding support mechanism or heating block 402. Bonding support mechanism 402 has a first surface 404 for supporting first lead tip 436 of lead 430. Bonding support mechanism 402 also includes a second support surface 406 for supporting lead tip 442 of lead 432. Surface 406 may be sized and configured to be smaller than lead tip 442.

A clamping mechanism 499 is shown holding leads 430 and 432 against support mechanism 402 with the clamping positioned just outboard of tape 460. With the support provided by surfaces 404 and 406, bonding wires 428 and 429 may be readily attached. Although FIG. 9 only shows two leads, it is to be understood that the bonding support mechanism 402 may be duplicated to accommodate all of the leads necessary for a chip, such as chip 322 of FIG. 7.

Although the invention has been particularly shown and described by the foregoing detailed description, it will be understood by those skilled in the art that various other changes in form and detail may be made without departing from the spirit and scope of the invention, which is defined by the appended claims.

What is claimed is:

1. A system for connecting a semiconductor chip to a leadframe, the system comprising:

a three-dimensional leadframe comprising:

a first lead having a first base portion, a first lead tip, and a first longitudinal axis, a second lead having a second base portion, a second lead tip, and a second longitudinal axis, the first and second leads formed substantially adjacent to each other, and the second lead having a stepped portion such that the lead tips of the first and second leads are separated in a Z-direction and in a Y-direction (where the Y-direction is parallel to the longitudinal axis of the leads and an X-direction intersects adjacent leads); and a bonding support mechanism for holding the three-dimensional leadframe during bonding, the support mechanism comprising:

a support body, a trough formed on the support body, the trough having a first surface at a first elevation, the first surface for supporting the second lead tip, a second surface formed on the support body at a second elevation and substantially adjacent to the first surface, the second surface for supporting the first lead tip, and wherein the first elevation and second elevation are displaced from each other.

2. The system of claim 1 wherein the bonding support mechanism further comprises a third surface formed on the support body at a third elevation for receiving a die paddle.

3. The system of claim 1 further comprising a clamping mechanism for holding the three-dimensional leadframe against the bonding support mechanism during bonding.

4. The system of claim 1 wherein the bonding support mechanism further comprises an angled surface formed on the support body adjacent the first surface for accommodating the stepped portion of the second lead.

5. The system of claim 1 wherein the trough of the bonding support mechanism has a longitudinal axis that is substantially perpendicular to the first longitudinal axis of the first lead when the first lead is placed on the bonding support mechanism.

6. The system of claim 1 further comprising a third surface formed on the support body at a third elevation and wherein the first elevation, second elevation, and third elevation are displaced from each other.

7. The system of claim 1 wherein the bonding support mechanism further comprises a ridge formed on the body adjacent the trough and wherein the second surface is formed on the ridge.

8. The system of claim 1 wherein the bonding support mechanism further comprises a fourth surface formed on the support body proximate the first surface, the fourth surface for supporting a base portion of a lead when placed on the support mechanism.

9. The system of claim 1 wherein the bonding support mechanism further comprises:

an angled surface formed on the support body adjacent the first surface for accommodating the stepped portion of the second lead;

a fourth surface formed on the body proximate the first surface, the fourth surface for supporting the first base portion and second base portion;

a ridge formed on the body adjacent the trough; and wherein the second surface is formed on the ridge.

10. The system of claim 1 wherein the bonding support mechanism further comprises:

an angled surface formed on the support body adjacent the first surface for accommodating the stepped portion of the second lead, a fourth surface formed on the body proximate the first surface, the fourth surface for supporting a base portion of a lead when placed on the support mechanism;

a ridge formed on the body adjacent the trough; and wherein the second surface is formed on the ridge, wherein the first elevation, second elevation, and third elevation are displaced from each other, and wherein the trough has a longitudinal axis and the trough is formed with an orientation so that the longitudinal axis of the trough is substantially perpendicular to the first longitudinal axis.

11. A bonding support mechanism for supporting a leadframe having planar leads, each with a first longitudinal axis, and downset leads, the support mechanism comprising:

a support body;

a trough formed on the support body, the trough having a first surface at a first elevation, the first surface for supporting a lead tip of a downset lead;

a second surface formed on the support body at a second elevation and substantially adjacent to the first surface, the second surface for supporting a lead tip of a planar lead;

a third surface formed on the support body at a third elevation for receiving a die paddle; and wherein the first elevation and second elevation are displaced from each other.

12. The bonding support mechanism of claim 11 further comprising an angled surface formed on the support body adjacent the first surface for accommodating a stepped portion of a downset lead.

13. The bonding support mechanism of claim 11 wherein the trough has a longitudinal axis and wherein the trough is formed with an orientation so that the longitudinal axis is substantially perpendicular to a longitudinal axis of a lead when placed on the support mechanism.

14. The bonding support mechanism of claim 11 wherein the first elevation, second elevation, and third elevation are displaced from each other.

15. The bonding support mechanism of claim 11 further comprising a ridge formed on the support body adjacent the trough and wherein the second surface is formed on the ridge.

16. The bonding support mechanism of claim 11 further comprising a fourth surface formed on the support body proximate the first surface, the fourth surface for supporting a base portion of a lead when placed on the support mechanism.

17. The bonding support mechanism of claim 11 further comprising:

an angled surface formed on the support body adjacent the first surface for accommodating a stepped portion of a downset lead;

a fourth surface formed on the support body proximate the first surface, the fourth surface for supporting a base portion of a lead when placed on the support mechanism;

a ridge formed on the support body adjacent the trough; and wherein the second surface is formed on the ridge.

18. The bonding support mechanism of claim 11 further comprising:

an angled surface formed on the support body adjacent the first surface for accommodating a stepped portion of a downset lead;

a fourth surface formed on the support body proximate the first surface, the fourth surface for supporting a base portion of a lead when placed on the support mechanism a ridge formed on the support body adjacent the trough;

wherein the second surface is formed on the ridge;

wherein the first elevation, second elevation, and third elevation are displaced from each other; and wherein the trough has a longitudinal axis and the trough is formed with an orientation so that the longitudinal axis of the trough is substantially perpendicular to a longitudinal axis of a lead when placed on the support mechanism.

* * * * *